(12) United States Patent
Gao et al.

(10) Patent No.: US 12,100,448 B2
(45) Date of Patent: Sep. 24, 2024

(54) STORAGE DEVICE AND DATA WRITING METHOD

(71) Applicants: Huawei Technologies Co., Ltd., Shenzhen (CN); TSINGHUA UNIVERSITY, Beijing (CN)

(72) Inventors: Bin Gao, Beijing (CN); Kanwen Wang, Shanghai (CN); Junren Chen, Beijing (CN); Rui Zhang, Shenzhen (CN); Huaqiang Wu, Beijing (CN)

(73) Assignees: Huawei Technologies Co., Ltd., Shenzhen (CN); TSINGHUA UNIVERSITY, Beijing (CN)

( * ) Notice: Subject to any disclaimer, the term of this patent is extended or adjusted under 35 U.S.C. 154(b) by 151 days.

(21) Appl. No.: 17/530,128

(22) Filed: Nov. 18, 2021

(65) Prior Publication Data

US 2022/0076746 A1  Mar. 10, 2022

Related U.S. Application Data

(63) Continuation of application No. PCT/CN2020/091582, filed on May 21, 2020.

(30) Foreign Application Priority Data

May 21, 2019 (CN) .......................... 201910424988.7
Jan. 8, 2020 (CN) .......................... 202010017923.3

(51) Int. Cl.
*G11C 13/00* (2006.01)
*G06N 3/065* (2023.01)
(52) U.S. Cl.
CPC ......... *G11C 13/0069* (2013.01); *G06N 3/065* (2023.01); *G11C 2013/0078* (2013.01); *G11C 2213/15* (2013.01)

(58) Field of Classification Search
CPC .... G11C 2013/0071; G11C 2013/0078; G11C 2013/009; G11C 13/00; G11C 13/0002;
(Continued)

(56) References Cited

U.S. PATENT DOCUMENTS 8,009,457 B2    8/2011  Li et al.
9,036,401 B2    5/2015  Meade et al.
(Continued)

FOREIGN PATENT DOCUMENTS

CN    101783183 B    8/2012
CN    107101718 A    8/2017
(Continued)

OTHER PUBLICATIONS

Matt Williams, What is Conductance?, Dec. 10, 2010, Universe Today Space and astronomy news (Year: 2010).*
(Continued)

*Primary Examiner* — Alfredo Bermudez Lozada
(74) *Attorney, Agent, or Firm* — Leydig, Voit & Mayer, Ltd.

(57) ABSTRACT

A storage device may be used in a neural network. The storage device includes a memristor unit, a current-controlled circuit, and a write circuit. The memristor unit has a structure of one-transistor and one-resistive random access memory (1T1R). The current-controlled circuit is configured to limit a current passing through the memristor unit to a target current, where the target current is determined based on target conductance of the memristor unit and a gate voltage of the transistor, and the target conductance is used to indicate target data to be written into the memristor unit. The write circuit is configured to load a write voltage to the memristor unit in cooperation with the current-controlled circuit, to write the target data to the memristor unit.

5 Claims, 10 Drawing Sheets

```
┌─────────────────────────────────────────────────┐    1410
│  A current-controlled circuit limits a current  │
│  passing through the memristor to a target      │
│  current                                        │
└─────────────────────────────────────────────────┘
                        │
┌─────────────────────────────────────────────────┐    1420
│  In cooperation with the current-controlled     │
│  circuit, a write circuit loads a write voltage │
│  to the memristor unit, to write the target     │
│  data to the memristor unit                     │
└─────────────────────────────────────────────────┘
```

(58) Field of Classification Search
CPC ............ G11C 13/0009; G11C 13/0021; G11C 13/0026; G11C 13/003; G11C 13/0069
See application file for complete search history.

(56) References Cited

U.S. PATENT DOCUMENTS

| | | | |
|---|---|---|---|
| 9,053,781 | B2 | 6/2015 | Tsai et al. |
| 9,257,178 | B1 * | 2/2016 | Chou ................ G11C 11/4074 |
| 9,805,770 | B1 * | 10/2017 | Merced Grafals ......................... G11C 13/0097 |
| 2014/0192604 | A1 | 7/2014 | Meade et al. |
| 2018/0342297 | A1 * | 11/2018 | Kim .................... G11C 11/5628 |
| 2021/0065795 | A1 * | 3/2021 | Mochida ............ G11C 13/0026 |

FOREIGN PATENT DOCUMENTS

| | | |
|---|---|---|
| CN | 108431895 A | 8/2018 |
| CN | 109343097 A | 2/2019 |
| CN | 109521826 A | 3/2019 |
| WO | 2017131628 A1 | 8/2017 |
| WO | 2017131651 A1 | 8/2017 |
| WO | 2018057766 A1 | 3/2018 |
| WO | 2018136187 A1 | 7/2018 |

OTHER PUBLICATIONS

Li et al., "Efficient and self-adaptive in-situ learning in multilayer memristor neural networks," Nature Communications 9, Article No. 2385, pp. 1-8 (2018).

Mochida et al., "A 4M Synapses integrated Analog ReRAM based 66.5 TOPS/W Neural-Network Processor with Cell Current Controlled Writing and Flexible Network Architecture," 2018 Symposium on VLSI Technology Digest of Technical Papers, pp. 175-176, Institute of Electrical and Electronics Engineers, New York, New York (Jun. 2018).

* cited by examiner

STORAGE DEVICE AND DATA WRITING METHOD

CROSS-REFERENCE TO RELATED APPLICATIONS

This application is a continuation of International Application No. PCT/CN2020/091582, filed on May 21, 2020, which claims priority to Chinese Patent Application No. 202010017923.3, filed on Jan. 8, 2020 and Chinese Patent Application No. 201910424988.7, filed on May 21, 2019. All of the aforementioned patent applications are hereby incorporated by reference in their entireties.

TECHNICAL FIELD

This application relates to the storage field, and in particular and more specifically, to a storage device and a data writing method.

BACKGROUND

A memristor, referred to as a memory resistor, is a circuit component indicating a relationship between magnetic flux and a charge. A memristor unit has a dimension of conductance, but different from the conductance, a resistance value of the memristor is determined by a charge flowing through the memristor. When the memristor is powered off, the conductance of the memristor does not change. In other words, the memristor has a memory function. If a high-resistance state of the memristor is defined as "1", and a low-resistance state is defined as "0", the memristor may implement a data storage function by using the resistance value of the memristor. At present, in a use process, a structure of one-transistor and one-resistive random access memory (1T1R) is usually used. The 1T1R can be referred to as the memristor unit.

During data writing, due to a device-to-device variation and a cycle-to-cycle variation of a same memristor, when a same pulse voltage is used to adjust conductance of different memristor units, a variation amount of adjusted conductance of each memristor unit is usually different. For one memristor unit, when a same pulse voltage is used to adjust conductance of the memristor unit in different programming periods, a variation amount of the conductance, of the memristor unit, adjusted in each programming period is also different.

In order to improve accuracy and speed of conductance adjustment, an incremental step pulse programming (ISPP) technology provides a "read verification-correction" method to adjust conductance of a target memristor unit. To be specific, each time a pulse (a set pulse or a reset pulse) is loaded to the target memristor unit to adjust the conductance of the target memristor unit, the adjusted conductance is read by using a read pulse. This operation is repeated, and an adjustment process ends until the conductance of the target memristor unit is adjusted to target conductance. However, by using the ISPP technology, each time conductance of one memristor unit is adjusted, a large quantity of "read verification-correction" processes are needed, and consequently, time for adjusting the conductance is long.

SUMMARY

This application provides a storage device and a storage device-based programming method, to help reduce time occupied to adjust conductance of a memristor unit, and improve a speed of writing data to the memristor unit.

According to a first aspect, a storage device is provided, including: a memristor unit, where the memristor unit has a structure of one-transistor and one-resistive random access memory (1T1R); a current-controlled circuit, configured to limit a current passing through the memristor unit to a target current, where the target current is determined based on target conductance of the memristor unit and a gate voltage of the transistor, and the target conductance is used to indicate target data to be written into the memristor unit; and a write circuit, configured to load a write voltage to the memristor unit in cooperation with the current-controlled circuit, to write the target data to the memristor unit.

In this embodiment of this application, the current-controlled circuit limits the current flowing through the memristor unit to the target current, and the target current is a current that can enable conductance of the memristor unit to be the target conductance. Then, the write circuit loads the write voltage to the memristor unit, to adjust the conductance of the memristor unit to the target conductance. Therefore, in a data writing process, because of existence of the current-controlled circuit, when the memristor unit writes data based on a write pulse, a case in which the conductance of the memristor unit exceeds the target conductance and needs to be continuously corrected does not occur. This avoids using a "read verification-correction" manner in the prior art, and reduces time occupied by writing data to the memristor unit.

In a possible implementation, the target current I, the write voltage $V_b$, the target conductance G, and a drain voltage $V_d$ of the transistor satisfy a formula $$G = \frac{I}{V_b - V_d}.$$

In this embodiment of this application, when the target conductance G and the write voltage $V_b$ are fixed, the target current is determined based on the target conductance, so that the current-controlled circuit limits the current flowing through the memristor unit to the target current. In other words, the conductance of the memristor unit can be adjusted to the current of the target conductance.

In a possible implementation, the current-controlled circuit includes a current mirror, the current mirror includes a first branch and a second branch that are connected in parallel, the second branch is connected to the memristor unit, a current passing through the first branch is the target current, and the current mirror is configured to replicate the target current from the first branch to the second branch, to limit the current flowing through the memristor unit to the target current.

In this embodiment of this application, the current-controlled circuit including the current mirror is used to limit the current flowing through the memristor unit. This helps simplify a structure of the current-controlled circuit.

Optionally, the current-controlled circuit further includes a current source, the current source is configured to provide a plurality of currents, and the plurality of currents includes the target current.

In a possible implementation, the current-controlled circuit provides a plurality of currents for the memristor unit, different currents in the plurality of currents correspond to different conductance of the memristor unit, and the plurality of currents include the target current.

In this embodiment of this application, the current-controlled circuit may provide the plurality of currents for the memristor unit. When currents are different, the conductance of the memristor unit may be different conductance values, to represent different data. This helps the memristor unit store different data.

In a possible implementation, a conductance value of first conductance $G_{max}$ in a plurality of pieces of conductance is the largest, the write voltage is less than a preset first write voltage threshold $V_{b\ max}$, the first write voltage threshold $V_{b\ max}$ satisfies a formula $$G_{max} = \frac{I_{max}}{V_{bmax} - V_d},$$

and $I_{max}$ represents a current for modulating the conductance of the memristor unit to the first conductance $G_{max}$.

Optionally, the write voltage is greater than or equal to an estimated switching voltage of the resistive random access memory, and the estimated switching voltage is higher than a real switching voltage of the memristor unit.

In this embodiment of this application, the write voltage is limited to be greater than or equal to the estimated switching voltage of the resistive random access memory, to ensure that a voltage sudden change occurs on the resistive random access memory.

In a possible implementation, a conductance value of second conductance $G'_{max}$ in the plurality of pieces of conductance that are of the memristor unit and that correspond to the plurality of currents is the largest, a second write voltage threshold $V'_{b\ max}$ satisfies a formula $$G'_{max} = \frac{I'_{max}}{V'_{bmax} - V'_{max}}, I'_{max}$$

represents a current for modulating conductance of the memristor unit to the second conductance $G'_{max}$, and if the second write voltage threshold is less than an estimated switching voltage of the resistive random access memory, the write voltage is the estimated switching voltage, and the estimated switching voltage is higher than a real switching voltage of the memristor unit.

In this embodiment of this application, if the second write voltage threshold is less than the estimated switching voltage of the resistive random access memory, the write voltage may be equal to the estimated switching voltage, to ensure that a voltage sudden change occurs on the resistive random access memory.

It should be noted that, the estimated switching voltage may be a sum of a statistical result of a plurality of voltages of the resistive random access memory and a voltage threshold, where the voltage threshold may be any value, for example, 0.2 V.

According to a second aspect, a storage device is provided, including: a storage array, where the storage array includes a plurality of memristor units, and each memristor unit has a structure of one-transistor and one-resistive random access memory (1T1R); a current-controlled circuit, configured to limit a current passing through a target memristor unit in the plurality of memristor units to a target current, where the target current is determined based on target conductance of the target memristor unit and a gate voltage of a transistor in the target memristor unit, and the target conductance is used to indicate target data to be written into the memristor unit; and a write circuit, configured to load a write voltage to the target memristor unit in cooperation with the current-controlled circuit, to write the target data to the target memristor unit.

In a possible implementation, the target current I, the write voltage $V_b$, the target conductance G, and a drain voltage $V_d$ of the transistor satisfy a formula $$G = \frac{I}{V_b - V_d}.$$

In a possible implementation, the storage device further includes a selection circuit, and the selection circuit is configured to select the target memristor unit from the storage array.

In a possible implementation, the current-controlled circuit includes a current mirror, the current mirror includes a first branch and a plurality of second branches, each second branch of the plurality of second branches is connected to one memristor unit in the storage array, and a current passing through the first branch is the target current; and the current mirror is configured to replicate the target current from the first branch to a target second branch of the plurality of second branches, to limit a current flowing through the target memristor unit connected to the target second branch to the target current.

According to a third aspect, a data writing method is provided, where the method is used to write data to a memristor unit, the memristor unit has a structure of one-transistor and one-resistive random access memory 1T1R, and the method includes: a current-controlled circuit limits a current passing through the memristor unit to a target current, where the target current is determined based on target conductance of the memristor unit and a gate voltage of the transistor, and the target conductance is used to indicate target data to be written into the memristor unit; and in cooperation with the current-controlled circuit, a write circuit loads a write voltage to the memristor unit, to write the target data to the memristor unit.

In a possible implementation, the target current I, the write voltage $V_b$, the target conductance G, and a drain voltage $V_d$ of the transistor satisfy a formula.

$$G = \frac{I}{V_b - V_d}.$$

DESCRIPTION OF EMBODIMENTS

The following describes technical solutions of this application with reference to accompanying drawings. For ease of understanding, an application scenario of embodiments of this application is first described with reference to FIG. 1 by using an example in which a function of a neural network is implemented through a crossbar. It should be noted that embodiments of this application are further applicable to another neural network, for example, a convolutional neural network. Embodiments of this application may be further applicable to a scenario in which a memristor unit is separately used to store data.

Figure 1:
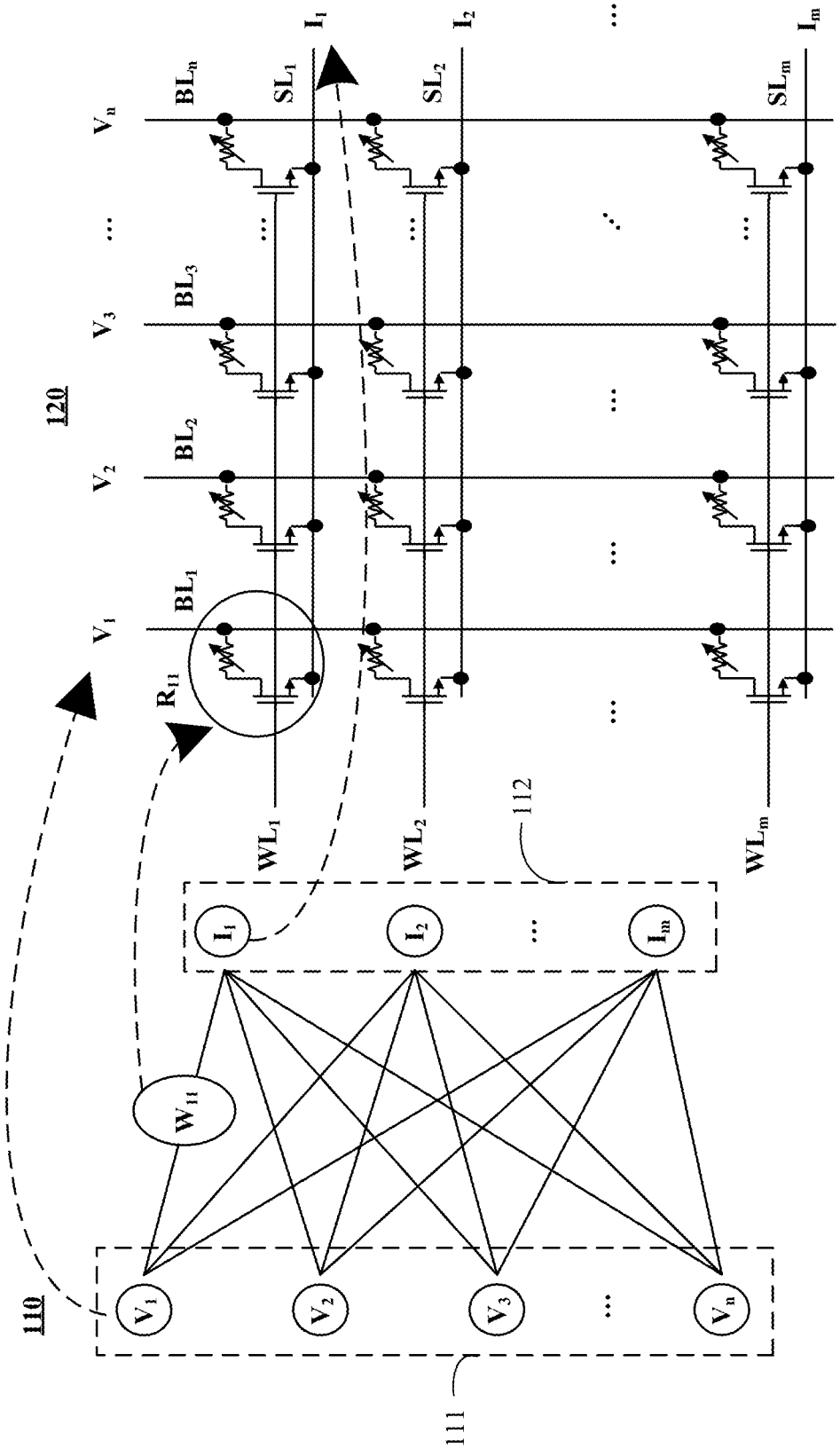
FIG. 1 is a schematic diagram of a mapping relationship between a neural network and a crossbar.

FIG. 1 is a schematic diagram of a mapping relationship between a neural network and a crossbar. The neural network 110 includes a plurality of neural network layers. In this embodiment of the present invention, the neural network layer is a logical layer concept, and one neural network layer means that one neural network operation needs to be performed. Each layer of neural network computation is implemented by a computing node (which may also be referred to as a neuron). In actual application, the neural network layer may include a convolutional layer, a pooling layer, and the like.

A person skilled in the art knows that when neural network computation (for example, convolution computation) is performed, a computing node in a neural network system may compute input data and a weight of a corresponding neural network layer. In the neural network system, a weight is usually represented by a real number matrix, and each element in a weight matrix represents a weight value. Because the computing node of the neural network system may use a resistive random access memory crossbar (ReRAM crossbar) formed by a resistive random access memory (ReRAM) to perform computation, and because the ReRAM has an advantage of integrating storage and computation, the weight can be configured to a ReRAM cell of the ReRAM crossbar before computation. In actual application, computing nodes that perform computation at a same neural network layer may share a weight, and computing nodes that perform computation at different neural network layers may have different weights. In this embodiment of the present invention, a weight of each computing node may be configured in advance.

For ease of description, a data processing process is described by using a first neural network layer in the neural network 110 as an example. In a neural network system, the first neural network layer may be any layer in the neural network system. For ease of description, the first neural network layer may be referred to as a "first layer" for short.

In FIG. 1, a ReRAM crossbar in a computing node is used as an example for illustration. The computation node may be configured to perform computation on the first neural network layer. The crossbar 120 shown in FIG. 1 is a crossbar of m×n. Bit lines$_i$ (bit line$_i$, BL$_i$) of memristor units in each column are connected, and word lines$_j$ (word line$_j$, WL$_j$) of memristor units in each row are connected. In a process of performing neural network computation, n pieces of input data $V_i$ may be represented by using pulses or input voltages loaded into the BL$_i$, for example, V1, V2, V3, ..., and Vn in FIG. 1. The weight in the weight matrix may be represented by conductance of a memristor unit located at an intersection point of a BL$_i$ and a WL$_j$. Different conductance of the memristor unit may indicate a different weight stored in the memristor unit. The computing node performs an operation on received input data V1, V2, V3, ..., and Vn and a weight configured in the computing node, to obtain m pieces of output data shown in 112 in FIG. 1. The m pieces of output data may be represented by a current on a source line$_i$ (source line$_i$, SL$_i$), for example, I1, I2, ..., and Im in FIG. 1.

The following describes a set operation and a reset operation by using an example in which target data is written to a target memristor unit located at the intersection point of the BL$_1$ and WL$_1$. The set operation is used to adjust the conductance of the memristor unit from a low conductance to a high conductance, and the reset operation is used to adjust the conductance of the memristor unit from the high conductance to the low conductance.

It is assumed that a target conductance range of a memristor unit R$_{11}$ may represent a target weight W$_{11}$. In a process of writing the W$_{11}$ to the target memristor unit, if current conductance of the target memristor unit is lower than a lower limit of the target conductance range, the set operation may be performed to increase the conductance of the target memristor unit. In this case, a voltage may be loaded to a gate of a transistor in the target memristor unit that needs to be adjusted through the WL$_1$ to turn on the transistor, so that the target memristor unit is in a selection state. In addition, an SL$_1$ connected to the target memristor unit and other BLs in the crossbar are also grounded, and then a set pulse is applied to the BL$_1$ in which the target memristor unit is located, to adjust the conductance of the target memristor unit.

On the contrary, if the current conductance of the target memristor unit is higher than an upper limit of the target conductance range, the reset operation may be performed to reduce the conductance of the target memristor unit. In this case, a voltage may be loaded to a gate of a transistor in the target memristor unit that needs to be adjusted through the WL$_1$, so that the target memristor unit is in a selection state. In addition, the BL$_1$ connected to the target memristor unit and other WLs in the crossbar are grounded. Then, a reset pulse is applied to the SL$_1$ in which the target memristor unit is located, to adjust the conductance of the target memristor unit.

Figure 2:
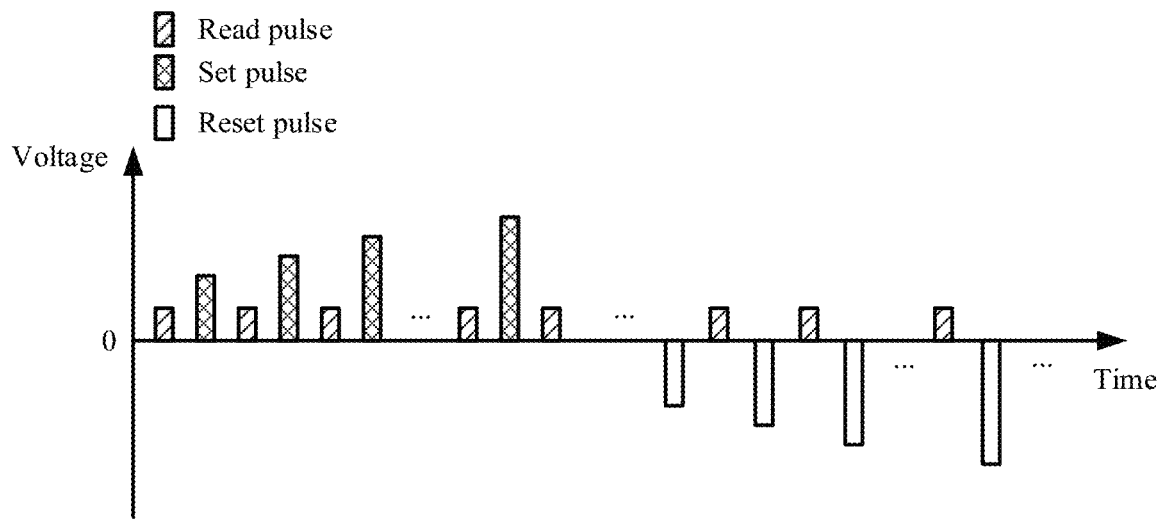
FIG. 2 is a schematic diagram of a process of writing target data to a target memristor according to an ISPP policy.

Based on the crossbar, the set operation, and the reset operation described in FIG. 1, the following describes a process of writing the target data to the target memristor unit according to an incremental step program pulse (ISPP) policy with reference to FIG. 2. The target memristor unit is any memristor unit in the foregoing crossbar. In a process of writing the target data to the target memristor unit, the ISPP policy usually adjusts the conductance of the target memristor unit in a "read verification-correction" manner, so that the conductance of the target memristor unit is finally adjusted to target conductance corresponding to the target data.

First, a read pulse is applied to the target memristor unit, the current conductance of the target memristor unit is read, and the current conductance is compared with the target conductance. If the current conductance is less than the target conductance, a first set pulse may be loaded to the target memristor unit, to increase the conductance of the target memristor unit, so that the conductance of the target memristor unit is adjusted to the target conductance, and then the adjusted conductance, namely, first conductance, is read by using the read pulse. If the first conductance is still less than the target conductance, a second set pulse may be loaded to the target memristor unit. A pulse width of the second set pulse is the same as a pulse width of the first set pulse, but an amplitude of the second set pulse is greater than an amplitude of the first set pulse. An enhanced set operation is performed, and the conductance of the target memristor unit, namely, second conductance, is continuously read by using the read pulse. If the second conductance is greater than the target conductance, a first reset pulse may be loaded to the target memristor unit, to increase the second conductance, so that the second conductance is adjusted to the target conductance. Until the conductance that is of the target memristor unit and that is read by using the read pulse is within an error range of the target conductance, the foregoing process of adjusting the conductance through "read verification-correction" ends.

Based on the foregoing description, an ISPP technology aims to adjust the conductance of the target memristor unit to the target conductance through a large quantity of "read verification-correction" processes. However, each time conductance of one memristor unit is adjusted, a large quantity of "read verification-correction" processes are needed, and consequently, time for adjusting the conductance is long.

To reduce time occupied for adjusting the conductance of the target memristor unit, this application provides a storage device. An electrical characteristic of a memristor unit of a 1T1R structure is used, to limit, by using a current-controlled circuit, a current flowing through the memristor unit. In this way, a conductance value of the memristor unit reaches a target conductance value, and no read verification is needed.

Figure 3A:
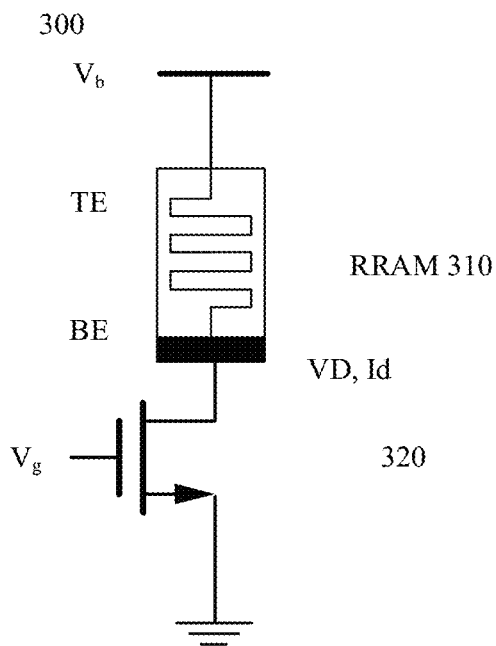
FIG. 3(a) is a schematic diagram of a memristor unit of a 1T1R structure.
Figure 4:
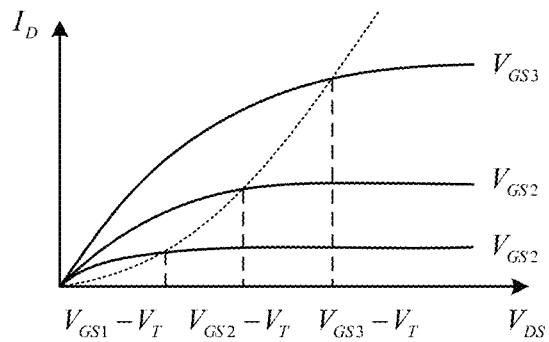
FIG. 4 is a schematic diagram of a current-voltage characteristic curve of a transistor.
Figure 5:
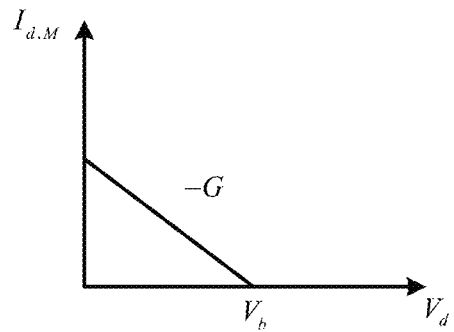
FIG. 5 is a schematic diagram of a current-voltage characteristic curve of an RRAM.
Figure 6:
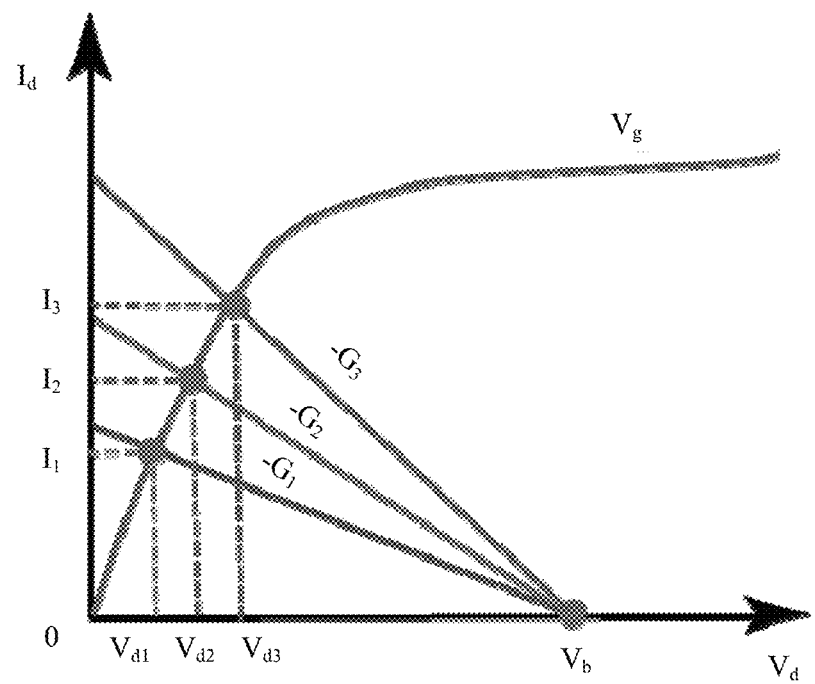
FIG. 6 is a schematic diagram of a current-voltage characteristic curve of a 1T1R memristor unit.

For ease of understanding, the following first describes the memristor unit of the 1T1R structure and a process of loading a set voltage to the memristor unit with reference to FIG. 3(a). With reference to FIG. 4 to FIG. 6, the electrical characteristic of the memristor unit of the 1T1R structure is described. FIG. 3 (a) is a schematic diagram of a memristor unit of a 1T1R structure. The memristor unit 300 shown in FIG. 3(a) includes a resistive random access memory (RRAM) 310 and a transistor (T) 320. The RRAM 310 is serially connected to the transistor 320, and a drain (D) of the transistor 320 is connected to a bottom electrode (BE) of the RRAM 310. During a set operation, a source (S) of the transistor is grounded. In other words, $V_S=0 \cdot V_b$ represents a pulse voltage used in the set operation.

For the transistor 320, after a voltage $V_b$ is loaded to the memristor unit, a current-voltage characteristic curve of the transistor satisfies the following formula:

$$I_D = f(V_{GS}, V_{DS}) \qquad (1), \text{where}$$

$I_D$ represents a current flowing through the drain of the transistor, $V_{GS}$ represents a gate-source voltage of the transistor, $V_{DS}$ represents a drain-source voltage applied to the transistor, and f( ) represents a function relationship. For a specific current-voltage characteristic curve of the transistor, refer to FIG. 4.

It can be seen from FIG. 4 that a working region of the transistor may be divided into two regions, that is, a triode region, which is also referred to as a "linear region" and a saturation region. In FIG. 4, a dashed line is used to represent a boundary between the linear region and the saturation region. When $V_{DS}<V_{GS}-V_T$, the transistor works in the linear region, which is collectively referred to as a linear region in the following. When $V_{DS}>V_{GS}-V_T$, the transistor works in the saturation region, where $V_T$ represents a turn-on voltage of the transistor. When values of $V_{GS}$ of a same transistor are different, current ranges of the linear region of the transistor are different.

For the RRAM 310, after loading $V_b$ on the RRAM, a current-voltage characteristic curve of the RRAM satisfies the following formula:

$$I_{d,M} = G(V_b - V_d) = -G(V_d - V_b) \qquad (2), \text{where}$$

G represents conductance of the RRAM. For a specific current-voltage characteristic curve of the RRAM, refer to FIG. 5.

For the formula (1), because $V_S=0$ and $V_{DS}=V_d-V_S$, $V_{DS}=V_d$. In addition, the transistor 320 and the RRAM 310 are connected in series. In this case, a current $I_D$ flowing through the transistor is equal to a current $I_{d,M}$ flowing through the RRAM, that is, $I_D=I_{d,M}=I_d$. Therefore, both a performance curve in FIG. 4 and a performance curve in FIG. 5 may be represented by using a coordinate system formed by $I_d$ and $V_d$, as shown in FIG. 6. Similarly, because $V_S=0$ and $V_{GS}=V_g-V_S$, $V_{GS}=V_g$. It can be seen from FIG. 6 that, when a set pulse voltage is given as $V_b$, a gate voltage of the transistor is $V_g$. If in a set process, $I_d$ is separately limited in $I_1$, $I_2$, $I_3$, and based on a characteristic of the linear region, it may be determined that voltages, of the transistor, corresponding to $I_1$, $I_2$, $I_3$ respectively are $V_{d1}$, $V_{d2}$, $V_{d3}$. An initial state of the RRAM is a low conductance state. In a process of adding a set pulse modulation conductance, the conductance of the RRAM gradually increases, I gradually increases, and final current values that can be reached are respectively $I_1$, $I_2$, $I_3$. Therefore, conductance of the RRAM is separately $G_1$, $G_2$, and $G_3$. In other words, the conductance values of the RRAM are absolute values of slopes of three straight lines shown in FIG. 6. Therefore, the conductance value of the RRAM may be determined according to a formula (3).

$$G = \frac{I}{V_b - V_d} \qquad (3)$$

In this embodiment of this application, based on a current-voltage characteristic of the memristor unit of the 1T1R structure shown in FIG. 6, in other words, after $V_b$ and $V_g$ are given, different currents flowing through the memristor unit correspond to different conductance values of the memristor unit. Based on the foregoing characteristic, an embodiment of this application provides a storage device. A current-controlled circuit in the storage device limits a current flowing through a memristor unit to a target current, and then loads a write voltage to the memristor unit, to adjust conductance of the memristor unit to target conductance corresponding to the target current. This avoids the "read verification" process described above, and reduces time occupied for adjusting the conductance of the memristor unit.

Figure 3B:
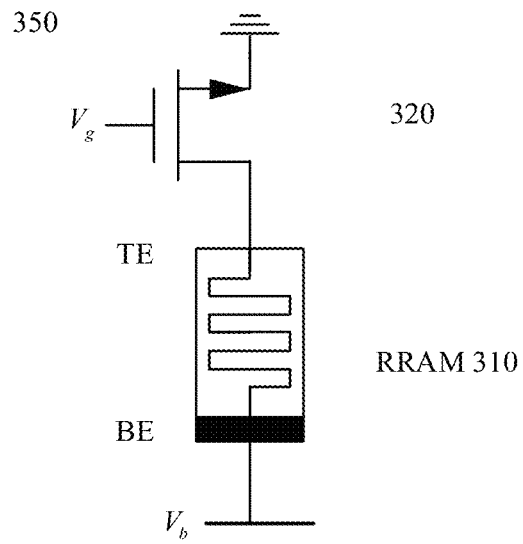
FIG. 3(b) is a schematic diagram of another memristor unit of a 1T1R structure.

It should be noted that the current-voltage characteristic curves described above according to the formula (1) to the formula (3) are also applicable to a memristor unit 350 of the 1T1R structure shown in FIG. 3(b). Same numbers are used for same elements in FIG. 3(b) and FIG. 3(a). A drain (D) of a transistor 320 in FIG. 3(b) is connected to a top electrode (TE) of an RRAM 310. Correspondingly, the write voltage may be loaded from a BE of the RRAM 310 to the memristor, and a source of the transistor is still grounded. Therefore, the transistor still satisfies $V_S=0$ and $V_{DS}=V_d$, and a current $I_D$ flowing through the transistor is equal to a current $I_{d,M}$ flowing through the RRAM. Based on this, both a current-voltage characteristic curve of the transistor and a current-voltage characteristic curve of the RRAM may be represented by using a coordinate system formed by $I_d$ and $V_d$, and satisfy the formula (3).

When the following describes the storage device in the embodiments of this application with reference to FIG. 7 to FIG. 14, only the memristor unit shown in FIG. 3(a) is used as an example for description. The memristor unit in the foregoing storage device may alternatively be the memristor unit 350 shown in FIG. 3(b). For brevity, details are not described again.

Figure 7:
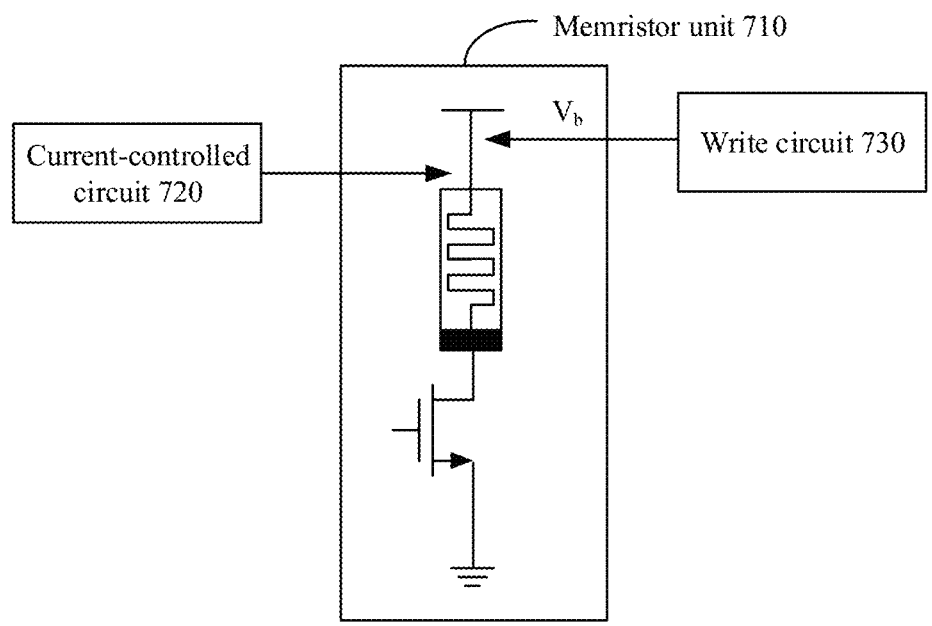
FIG. 7 is a schematic diagram of a storage device according to an embodiment of this application.

FIG. 7 is a schematic diagram of a storage device according to an embodiment of this application. The storage device 700 shown in FIG. 7 includes a memristor unit 710, a current-controlled circuit 720, and a write circuit 730.

The memristor unit 710 has a structure of one-transistor and one-resistive random access memory 1T1R.

The current-controlled circuit 720 is configured to limit a current passing through the memristor unit to a target current, where the target current is determined based on target conductance of the memristor unit and a gate voltage of the transistor, and the target conductance is used to indicate target data to be written into the memristor unit.

The write circuit 730 is configured to load a write voltage to the memristor unit in cooperation with the current-controlled circuit, to write the target data to the memristor unit.

The transistor may be an N-channel metal oxide semiconductor (NMOS) transistor, or may be a P-channel metal oxide semiconductor (PMOS) transistor, or the like.

The foregoing target current is determined based on the target conductance of the memristor unit and the gate voltage of the transistor. It may also be understood that, when the write voltage and the gate voltage of the transistor are determined, the target current is a current corresponding to the target conductance, and the current corresponding to the target conductance is an intersection point of a current-voltage characteristic curve of the transistor and a current-voltage characteristic curve of the RRAM.

When the foregoing transistor works in a linear region, there is an approximate linear relationship between the target current and a drain-source voltage of the transistor. When the write voltage is fixed, the target current, the target conductance, and a drain voltage of the transistor are in a one-to-one correspondence. In this way, the current-controlled circuit controls the current flowing through the memristor unit. In other words, the memristor unit may be adjusted to the target conductance. For the structure of the memristor unit shown in FIG. 3(a), a process of adjusting the conductance of the memristor unit through a set operation may be performed. For the structure of the memristor unit shown in FIG. 3(b), a process of adjusting the conductance of the memristor unit through a reset operation may be performed.

For example, in a process of writing data to the memristor unit 300 shown in FIG. 3(a), an initial state of the memristor unit is first adjusted to a high-resistance state (namely, a low conductance) through a reset operation. In this case, the write circuit may be used to load the write voltage, namely, a set pulse, to the memristor unit, to adjust the memristor unit from the high-resistance state to a low-resistance state. In this case, as a quantity of set pulses loaded to the memristor unit increases, resistance of the memristor unit continuously decreases, the conductance increases, and the current flowing through the memristor unit increases. However, due to existence of the current-controlled circuit, a maximum value of the current flowing through the memristor unit is the target current. Therefore, based on a correspondence between the current and the conductance, after the conductance of the memristor unit is adjusted to the target conductance corresponding to the target current, even if the set pulse is continuously loaded, the conductance of the memristor unit no longer changes.

It should be noted that, in the foregoing process of adjusting the conductance of the memristor unit by loading the set pulse, the process of adjusting the memristor unit from an initial conductance to the target conductance may include the process of loading a plurality of set pulses to the memristor unit. A quantity of set pulses loaded and pulse widths may be preconfigured based on a model of the memristor unit, to ensure that after the memristor unit is loaded with a preset quantity of set pulses, the initial conductance may be adjusted to the target conductance.

For another example, in a process of programming the memristor unit 350 shown in FIG. 3(b), an initial state of the memristor unit is adjusted to a low-resistance state (namely, a high conductance), and the write circuit may load the write voltage, namely, a reset pulse, to the memristor unit, to adjust the memristor unit from the low-resistance state to a high-resistance state. In this case, as a quantity of reset pulses loaded to the memristor unit increases, resistance of the memristor unit continuously increases, the conductance decreases, and the current flowing through the memristor unit decreases. However, due to existence of the current-controlled circuit, a minimum value of the current flowing through the memristor unit is the target current. Therefore, based on a correspondence between the current and the conductance, after the conductance of the memristor unit is adjusted to the target conductance corresponding to the target current, even if the reset pulse is continuously loaded, the conductance of the memristor unit no longer changes.

It should be noted that, in the foregoing process of adjusting the conductance of the memristor unit by loading the reset pulse, the process of adjusting the memristor unit from an initial conductance to the target conductance may include the process of loading a plurality of reset pulses to the memristor unit. A quantity of reset pulses loaded and pulse widths may be preconfigured based on a model of the memristor unit, to ensure that after the memristor unit is loaded with a preset quantity of reset pulses, the initial conductance may be adjusted to the target conductance.

It should be noted that the target conductance G is one of a plurality of pieces of conductance that can be provided by the memristor unit, and currents for modulating the conductance of the memristor unit into different conductance in the plurality of pieces of conductance are different. In other words, the current that is limited by the current-controlled circuit and that flows through the memristor unit may include a plurality of target currents, and each target current corresponds to one target conductance, so that the conductance of the memristor unit may be a plurality of pieces of target conductance corresponding to the plurality of target currents, to store a plurality of pieces of target data.

For example, in FIG. 6, if the set pulse voltage is given as $V_b$, and the gate voltage of the transistor is given as $V_g$, the current that is limited by the current-controlled circuit and that flows through the memristor unit is $I_1$, and the adjusted target conductance of the RRAM is $G_1$, and is used to record first target data. The current that is limited by the current-controlled circuit and that flows through the memristor unit is $I_2$. In this case, the adjusted target conductance of the RRAM is $G_2$, and is used to record second target data. The current that is limited by the current-controlled circuit and that flows through the memristor unit is $I_3$. In this case, the adjusted target conductance of the RRAM is $G_3$, and is used to record third target data.

The current-controlled circuit may be implemented in many manners, and a current-controlled circuit based on a current source and a current mirror may be used. The current mirror may be a basic current mirror of a MOS transistor, or may be a bipolar basic current mirror, a cascade current mirror, or the like.

Figure 8:
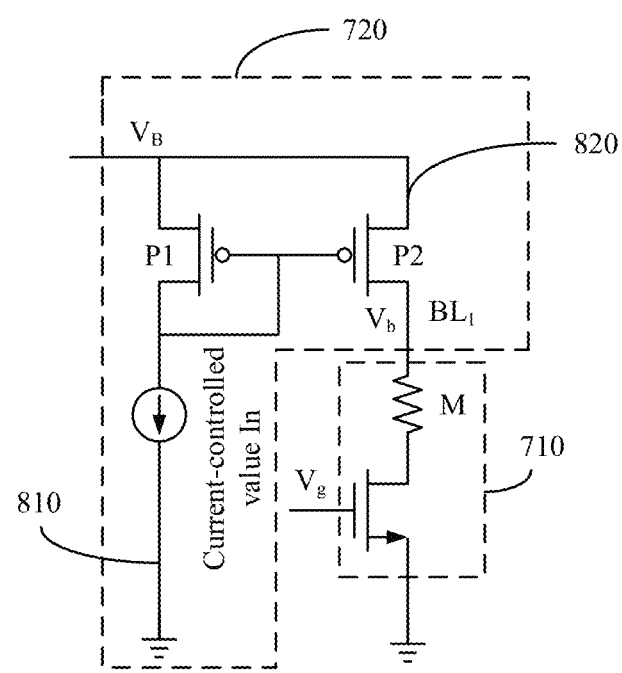
FIG. 8 is a schematic diagram of a storage device according to an embodiment of this application.

FIG. 8 is a schematic diagram of another storage device according to an embodiment of this application. The storage device 800 shown in FIG. 8 and the storage device 700 shown in FIG. 7 use a same number for circuits having a same function. For brevity, details are not described herein again.

A current-controlled circuit 720 includes a current mirror. The current mirror includes a first branch 810 (also referred to as an input branch) and a second branch 820 (also referred to as an output branch) that are connected in parallel. The second branch 820 is connected to a memristor unit 710, a current passing through the first branch 810 is a target current, and the current mirror is configured to limit, based on the target current, that a maximum current flowing through the memristor unit is the target current.

The current mirror may be a basic current mirror of a MOS transistor, and includes a first MOS transistor 811 and a second MOS transistor 821. The first MOS transistor is located on the first branch 810, and the second MOS transistor is located on the second branch 820. Because the first branch and the second branch are connected in parallel, so that a source voltage of the first MOS transistor (represented by P1 in FIG. 8) is the same as a source voltage of the second MOS transistor (represented by P2 in FIG. 8), and a gate of the first MOS transistor is connected to and short-circuited with a gate of the second MOS transistor. In this way, when gate voltages of the two MOS transistors are the same and source voltages of the two MOS transistors are the same, based on a characteristic of the MOS transistor, it may be considered that currents flowing through the two MOS transistors are the same. In other words, the target current of the first branch is the same as the current flowing through the second MOS transistor.

Optionally, the foregoing current mirror may be connected to a plurality of second branches 820 through a selection circuit, and each second branch is separately connected to a plurality of memristor units, so that the current mirror may be connected to the plurality of memristor units through the plurality of second branches, to provide a current-controlled function for the plurality of memristor units, to adjust conductance of the plurality of memristor units. For details about a connection manner, refer to introduction below.

In a data writing process, before conductance of the memristor unit reaches target conductance, the conductance of the memristor unit changes with a quantity of times of loading a write voltage. As a result, a current of the second branch is slightly different from the current of the first branch. However, when the conductance of the memristor unit changes to the target conductance, the current flowing through the second branch is the target current. The following uses a process of adjusting the conductance of the memristor unit 300 through the set operation as an example to describe a working principle of the current mirror.

After the reset operation, the memristor unit is in the high-resistance state, and current conductance of the memristor unit is less than the target conductance. Therefore, the set pulse needs to be loaded to the memristor unit, to adjust the memristor unit to the low-resistance state. As a quantity of times of loading the set pulse increases, a resistance value of the memristor unit decreases, and the conductance increases. As a result, the current flowing through the second branch increases. However, due to limitation of a "reference current" (namely, the target current) provided by the first branch of the current mirror, a maximum value of the current on the second branch is the target current.

Correspondingly, in a process of adjusting the conductance of the memristor unit 350 through the reset operation, if the initial state of the memristor unit is the low-resistance state, current conductance of the memristor unit is greater than the target conductance, and the reset pulse needs to be loaded to the memristor unit, to adjust the memristor unit to a high-resistance state. As a quantity of times of loading the reset pulse increases, a resistance value of the memristor unit increases, and the conductance decreases. As a result, the current flowing through the second branch decreases. However, due to limitation of a "reference current" (namely, the target current) provided by the first branch of the current mirror, a minimum value of the current on the second branch is the target current.

It should be noted that FIG. 8 shows only some elements in the current-controlled circuit, and the current-controlled circuit may further include other elements. This is not limited in this embodiment of this application.

Optionally, the storage device 700 may further include a programming control circuit 910 and a gate voltage generation circuit 920. For a specific structure, refer to FIG. 9. It should be noted that, a storage device shown in FIG. 9 and the storage device shown in FIG. 7 that have a same function use a same number.

The programming control module 910 is configured to control an operation time sequence of an entire programming process, a working mode of each circuit module, and the like. For example, the programming control module controls the write circuit to generate a set pulse with an amplitude of $V_b$, controls the current-controlled circuit to limit the current flowing through the memristor unit to the target current, and controls the gate voltage generation circuit to provide a voltage for the gate of the transistor.

It should be noted that the foregoing programming process in this embodiment of this application includes the data writing process mentioned above.

Optionally, the programming control module 910 may further control an initialization circuit to perform an initialization (Forming) operation on the RRAM, control a reset circuit to perform a reset operation on the RRAM, and the like.

The gate voltage generation module 920 is configured to provide a variable gate voltage for the entire programming process, to be applied to the initialization operation, the set operation, and the reset operation. The gate voltages for the initialization operation, the set operation, and the reset operation are different.

For different memristor units, a current-controlled range of the foregoing current-controlled circuit, a setting condition of the gate voltage of the transistor, and a setting condition of the write voltage $V_b$ need to be set based on an actual circuit. The following focuses on setting conditions of the foregoing three parameters.

1. Current-Controlled Range of the Current-Controlled Circuit

It is assumed that a minimum value of the target conductance is programmed to $G_{min}$ and a maximum value of the target conductance is programmed to $G_{max}$. According to a formula $$G = \frac{I}{V_b - V_d},$$

with reference to a manufacturing process of the RRAM and a CMOS, when the gate voltage is given as $V_g$, a value of a linear region $(V_b - V_d)$ may be roughly estimated as $(V_b - V_d)^{forecast}$, and the foregoing $G_{min}$ and $G_{max}$ may be used to calculate predicted minimum current-controlled values $$I_{min}^{forecast} = G_{min}(V_b - V_d)_{max}^{forecast}$$

and $I_{max}^{forecast} = G_{max}(V_b - V_d)_{min}^{forecast}$. Therefore, a current-controlled range $[I_{min}, I_{max}]$ that can be actually implemented by the current-controlled circuit may be designed to be greater than a predicted current range $[I_{min}^{forecast}, I_{max}^{forecast}]$, to reserve a sufficient margin to ensure that a conductance limit value obtained through actual programming can satisfy a requirement.

2. Setting Condition of the Gate Voltage of the Transistor

According to FIG. 4, it can be learned that selection of the gate voltage $V_g$ of the transistor is closely related to a size of the linear region of the transistor. Therefore, the setting condition of the gate voltage is mainly to ensure that a current range of a linear region of an I-V characteristic curve of the transistor may be divided into a plurality of current-controlled values to represent a plurality of pieces of target data by using a plurality of pieces of target conductance under a working condition of the gate voltage $V_g$. For example, if data that needs to be represented is 4 bits (bit), there may be $2^4 = 16$ different data that needs to be represented, and correspondingly, 16 different pieces of data need to correspond to 16 different target currents. Therefore, the linear region of the transistor needs to be capable of dividing 16 target currents, or it may be understood that the gate voltage $V_g$ with a sufficient saturation current (namely, a current corresponding to the transistor in a saturation region) needs to be selected.

Figure 9:
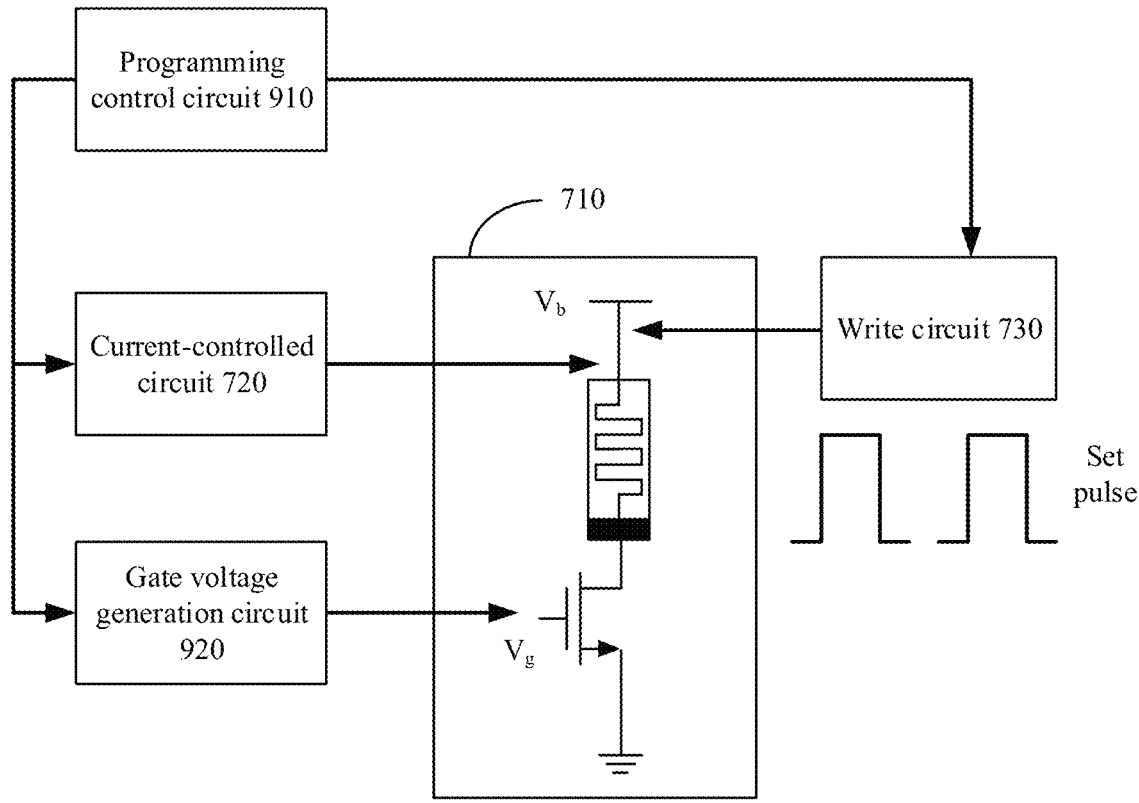
FIG. 9 is a schematic diagram of a storage device according to an embodiment of this application.

Using the 1T1R structure shown in FIG. 9 as an example, the RRAM is connected to a drain of the transistor, and when the set operation is performed, a source of the transistor is grounded. A maximum current value of actual write data is limited by the current-controlled circuit. Therefore, even if the $V_g$ is a power supply voltage $V_{DD}$ of a corresponding transistor process, the saturation current that can be reached is large. However, programming power consumption is determined by a pulse voltage amplitude $V_b$ and the current-controlled value.

Considering that as a size of a process feature decreases, a working voltage decreases, and a maximum saturation current that can be reached by the transistor also decreases. To ensure that there is still a sufficient current range, a transistor with a power supply voltage lower than 3.3 V may directly select $V_g = V_{DD}$, and a transistor with a power supply voltage higher than 3.3 V may select $V_g < V_{DD}$ based on an actual application, to ensure that the saturation current under the gate voltage is greater than a required maximum current-controlled value.

It is assumed that the maximum current-controlled value during programming is $I_{max}$, so that when the saturation current $I_{saturation} = I_{max}$, the gate voltage is $V_g$th, where a value range of $V_g$ is $V_g$th$< V_g \leq V_{DD}$.

3. Setting condition of $V_b$

A voltage amplitude $V_b$ of the set pulse mainly satisfies the following two requirements: (1) Ensure that the RRAM can be resisted. (2) After being loaded to the memristor unit, the conductance of the memristor unit may reach the maximum conductance value $G_{max}$ that needs to be programmed.

(1) Ensure that the RRAM can be Resisted

First, it is ensured that the voltage amplitude $V_b$ of the set pulse is higher than a sudden change voltage $V_c(V_{change})$ of the set operation in a direct current (DC) scanning process of an RRAM component, to resist the RRAM.

Specifically, $V_c$ of the RRAM may be determined in the following manner: performing a DC scanning test on 1T1R arrays on different silicon wafers (wafer) and different dies (die) randomly extracted from RRAM components of a same batch of wafers, and collecting statistics on sudden change voltages of enough components. If a maximum value of the sudden change voltage obtained through statistics collection is $V_{c,max}$, a minimum value of $v_b$ needs to be greater than $V_{c,max}$. Usually, to ensure that a sudden change of a voltage occurs on the RRAM, a voltage (also referred to as an "estimated switching voltage") that is greater than the maximum value of the sudden change voltages may be selected on the basis of the maximum value of the sudden change voltages, for example, $(V_{c,max} + 0.2)$V may be selected, to increase a probability of triggering the sudden change of the voltage on the RRAM. On the other hand, a larger value of $V_b$ indicates greater power consumption of the storage device in the programming process. Usually, a maximum value of $V_b$ is the power supply voltage $V_{DD}$ of the transistor, that is, $(V_{c,max} + 0.2) \leq V_b \leq V_{DD}$.

(2) After being Loaded to the Memristor Unit, the Conductance of the Memristor Unit May Reach the Maximum Conductance Value $G_{max}$ that Needs to be Programmed.

Theoretically, a minimum value of G can be close to 0. In other words, the RRAM is in a very high resistance state. A maximum value of G is usually related to $V_b$. It is assumed that $V_g = V_{DD}$, and the target conductance $$G = \frac{I}{V_b - V_d},$$

it can be seen that G is an increasing function of a current I, and G is a decreasing function of $V_b$. Because I needs to be less than a saturation current when $V_g = V_{DD}$, a maximum value of I is limited by $V_g$, and cannot infinitely increase. Therefore, the maximum value of G is related to $V_b$.

Assuming that a maximum value of the target conductance is $G_{max}$, the maximum value $V_{b,max}$ of $V_b$ may be calculated according to a formula $V_{b,max} = I_{max}/G_{max} + V_d$. When $V_{b,max} = V_{DD}$, a value range of $V_b$ is $(V_{c,max} + 0.2) \leq V_b \leq V_{b,max}$.

The setting condition of $V_b$ described above is usually a setting condition in an ideal case. However, in an actual configuration process, setting of an actual parameter of the memristor unit may affect the setting condition of $V_b$. The following mainly describes the setting condition of $V_b$ in three cases. It is assumed that the current-controlled range of the current-controlled circuit is $[I_{min}, I_{max}]$.

Case 1: When $V_{b,max} < (V_{c,max}+0.2)V$, $V_b = (V_{c,max}+0.2)V$.

It should be noted that, if the maximum value that is of G and that can be reached by a current-controlled limit $I_{max}$ is less than the maximum value $G_{max}$, of the target conductance, if it is still required to implement $G_{max}$ in this case, $I_{max}$ of the current-controlled circuit needs to be improved.

Case 2: When $(V_{c,max}+0.2)V \leq V_{b,max} \leq V_{DD}$, $(V_{c,max}+0.2) V \leq V_b \leq V_{b,max}$;

Case 3: When $V_{b,max} > V_{DD}$, $V_b = V_{DD}$.

Figure 10:
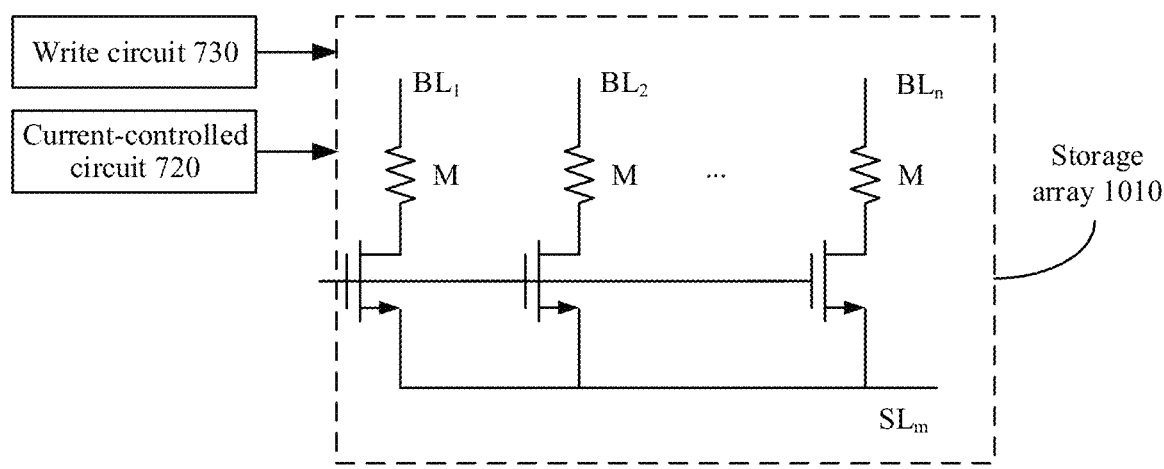
FIG. 10 is a schematic diagram of a storage device according to an embodiment of this application.

The method in this embodiment of this application may be applied to a storage array. The following describes, with reference to FIG. 10, a scenario in which the solution in this embodiment of this application is applied to the storage array. FIG. 10 is a schematic diagram of a storage device according to an embodiment of this application. The storage device shown in FIG. 10 includes a storage array 1010, a current-controlled circuit 720, and a write circuit 730. It should be noted that modules that implement a same function in the storage device shown in FIG. 10 and the storage device shown in FIG. 7 use a same number. For a specific description, refer to the foregoing description. For brevity, details are not described herein again.

The storage array 1010 includes a plurality of memristor units, and the plurality of memristor units are structures of one-transistor and one-resistive random access memory 1T1R.

The current-controlled circuit 720 is configured to limit a current passing through a target memristor unit in the plurality of memristor units to a target current, where the target current is determined based on target conductance of the target memristor unit and a gate voltage of a transistor in the target memristor unit, and the target conductance is used to indicate target data to be written into the memristor unit.

The write circuit 730 is configured to load a write voltage to the target memristor unit in cooperation with the current-controlled circuit, to write the target data to the target memristor unit.

The storage array may be a storage array in a memory, or a crossbar integrating storage and computation in a neural network processor. This is not limited in this embodiment of this application.

Optionally, the storage device 1000 further includes a selection circuit, and the selection circuit is configured to select the target memristor unit from the storage array.

Optionally, the selection circuit may select a plurality of memristor units at a time, or the selection circuit may select one memristor unit at a time. When the selection circuit selects the plurality of memristor units at the same time, same target data may be written into the plurality of memristor units at the same time by cooperating with the current-controlled circuit.

Figure 11:
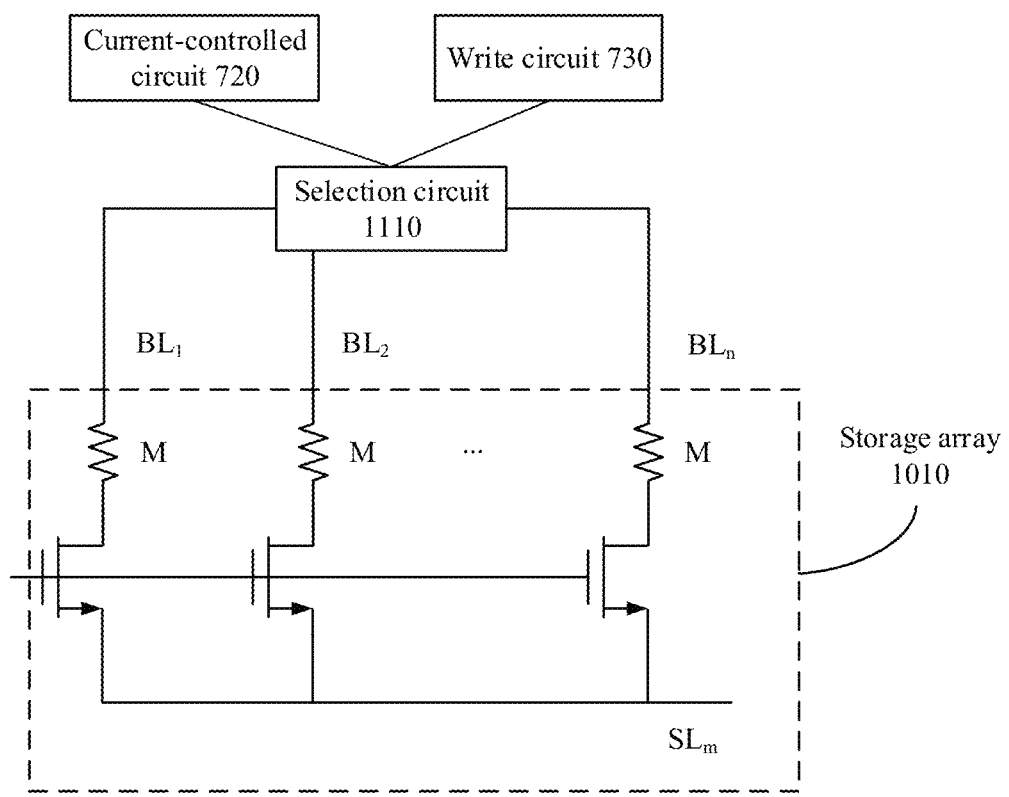
FIG. 11 is a schematic diagram of a storage device according to an embodiment of this application.

FIG. 11 is a schematic diagram of a storage device according to an embodiment of this application. The storage device shown in FIG. 11 and the storage device shown in FIG. 10 that have a same function use a same number. The storage device 1100 shown in FIG. 11 includes a storage array 1010, a current-controlled circuit 720, a write circuit 730, and a selection circuit 1110.

The selection circuit 1110 is configured to select a memristor unit that data is to be written to, so that the write circuit 730 can load the write voltage to the memristor unit, and the current-controlled circuit 720 can limit the current flowing through the memristor unit.

Optionally, the current-controlled circuit includes a current mirror, the current mirror includes a first branch and a plurality of second branches, each second branch of the plurality of second branches is connected to one memristor unit in the storage array, and a current passing through the first branch is the target current; and the current mirror is configured to replicate the target current from the first branch to a target second branch of the plurality of second branches, to limit a current flowing through the target memristor unit connected to the target second branch to the target current.

Figure 12:
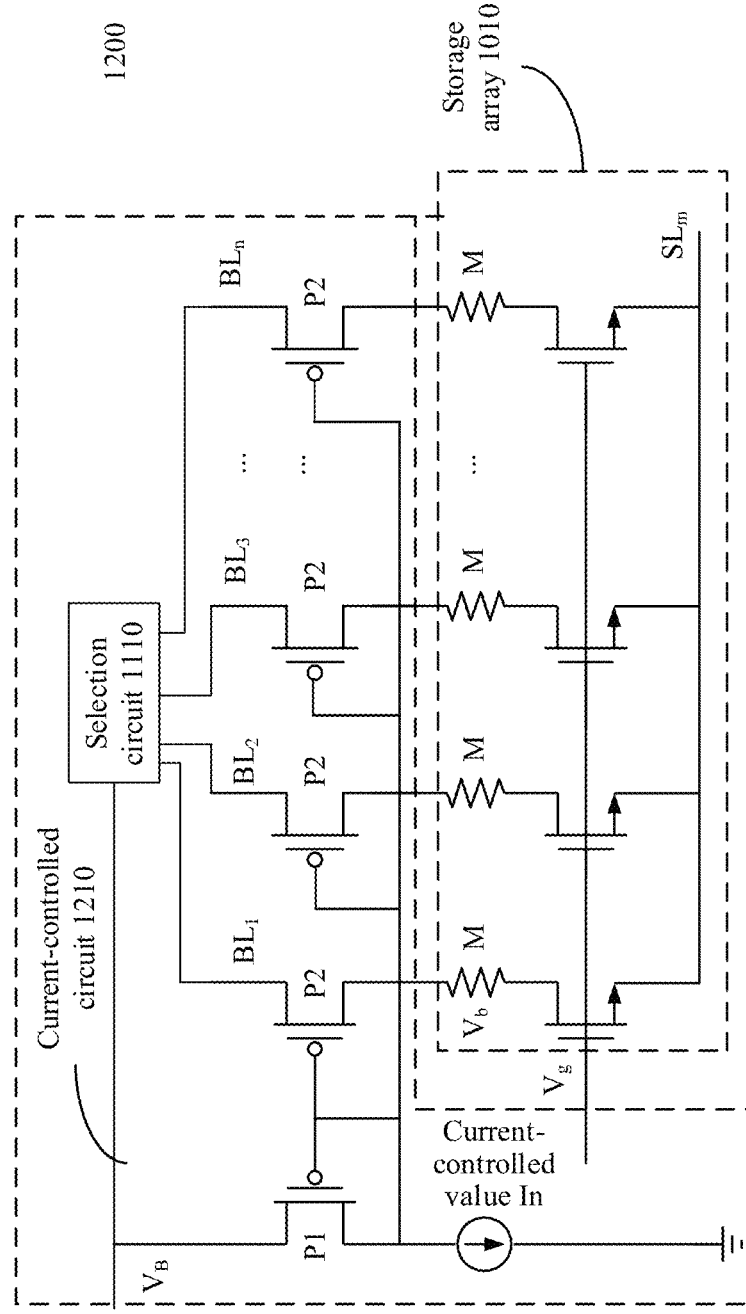
FIG. 12 is a schematic diagram of a storage device according to an embodiment of this application.

FIG. 12 is a schematic diagram of a storage device according to an embodiment of this application. The storage device shown in FIG. 12 and the storage device shown in FIG. 11 that have a same function use a same number. It should be noted that FIG. 12 shows only elements different from those in the storage device shown in FIG. 11. The following describes functions of the selection circuit and the current-controlled circuit with reference to FIG. 12.

The current-controlled circuit in the storage device 1200 shown in FIG. 12 includes a current mirror 1210. The current mirror 1210 includes a first branch (also referred to as an input branch) and a plurality of second branches (also referred to as output branches) $BL_1, BL_2, \ldots,$ and $BL_n$. A gate of a MOS transistor P1 on the first branch is short-circuited with gates of MOS transistors P2 on the plurality of second branches. Based on a characteristic of the current mirror, a current flowing through the plurality of MOS transistors on the second branch may be limited to be equal to a current flowing through the MOS transistor on the first branch.

For example, using the memristor unit 300 shown in FIG. 3(a) as an example, when the set pulse voltage is loaded to the memristor unit 300 to adjust the conductance of the memristor unit, the current mirror may limit a maximum current flowing through the MOS transistors on the plurality of second branches to be equal to the current flowing through the MOS transistor on the first branch.

For another example, using the memristor unit 350 shown in FIG. 3(b) as an example, when the reset pulse voltage is loaded to the memristor unit 350 to adjust the conductance of the memristor unit, the current mirror may limit a minimum current flowing through the MOS transistors on the plurality of second branches to be equal to the current flowing through the MOS transistor on the first branch.

The selection circuit 1110 is configured to select the target second branch from the plurality of second branches, where the target second branch is connected to the target memristor unit.

The first branch of the current mirror is configured to limit a current of the target second branch to the target current.

Correspondingly, an embodiment of this application further provides a connection manner between the current mirror and the selection circuit. To be specific, the current mirror includes the first branch and the second branch, and a drain of a MOS transistor on the second branch is connected to a plurality of memristor units through the selection circuit 1110. The current of the first branch is the target current, and the current mirror is configured to replicate the target current from the first branch to the second branch, to limit the maximum current flowing through the target memristor unit on the second branch to the target current.

Figure 13:
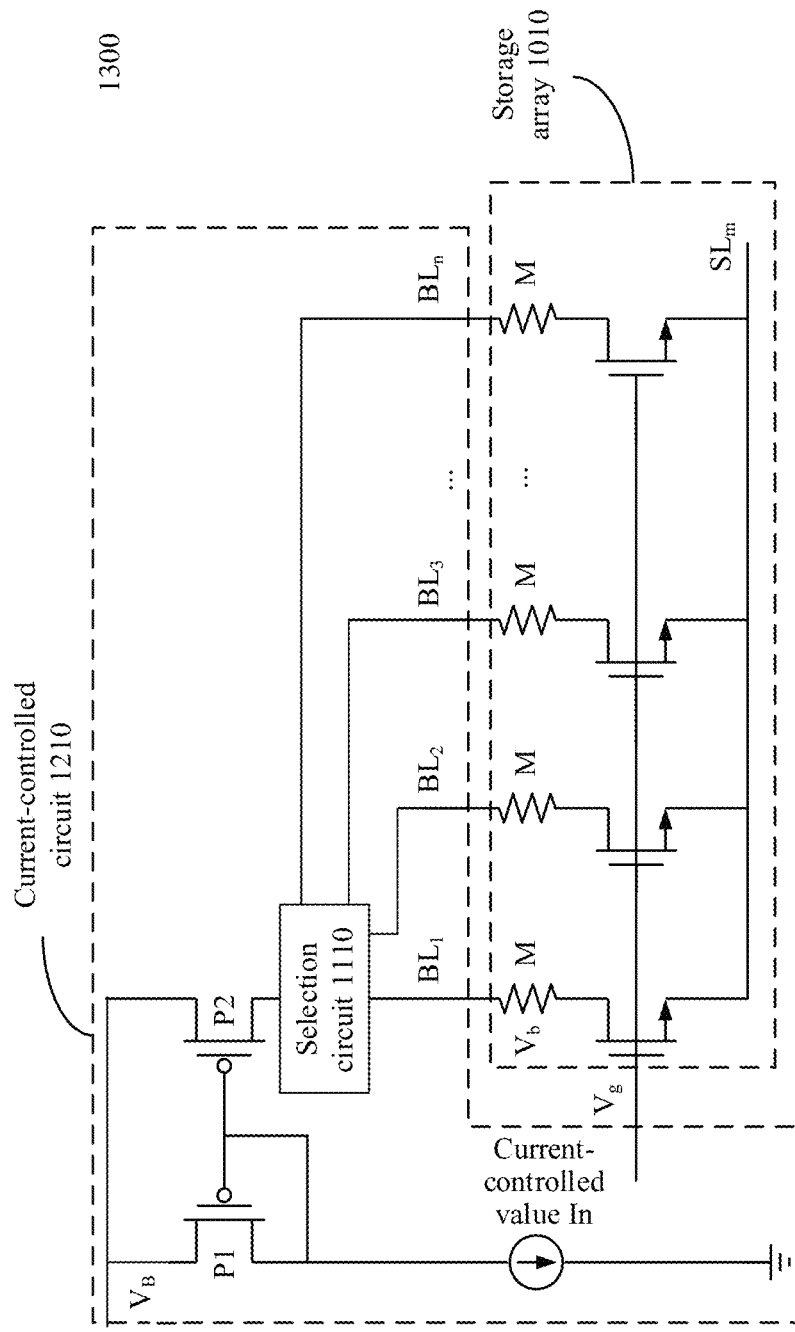
FIG. 13 is a schematic diagram of a storage device according to another embodiment of this application.

FIG. 13 is a schematic diagram of a storage device according to another embodiment of this application. The storage device shown in FIG. 13 and the storage device shown in FIG. 12 that have a same function use a same number. The following mainly describes another connection manner of the selection circuit and the current-controlled circuit with reference to FIG. 13.

The current-controlled circuit 1210 in the storage device 1300 shown in FIG. 13 includes a current mirror. The current mirror 1210 includes a first branch (also referred to as an input branch) and a second branch (also referred to as an output branch). The second branch is connected to a plurality of memristor units through the selection circuit 1110. Connections between memristor units and the selection circuit are represented by a $BL_i$, a $BL_2$, . . . , and a $BL_n$. A gate of a MOS transistor P1 on the first branch is short-circuited with a gate of a MOS transistors P2 on the second branch. Based on a characteristic of the current mirror, a maximum current of currents that separately flows through a plurality of MOS transistors on the second branch is equal to a current that flows through the MOS transistor on the first branch.

The selection circuit 1110 is configured to select the target memristor unit from the plurality of memristor units connected to the second branch.

The first branch of the current mirror is configured to limit a maximum value of a current flowing through the target memristor unit to the target current.

In this embodiment of this application, a plurality of memristor units may share the MOS transistor located on the second branch in the current mirror. This helps reduce a quantity of elements in the storage device.

Figure 14:
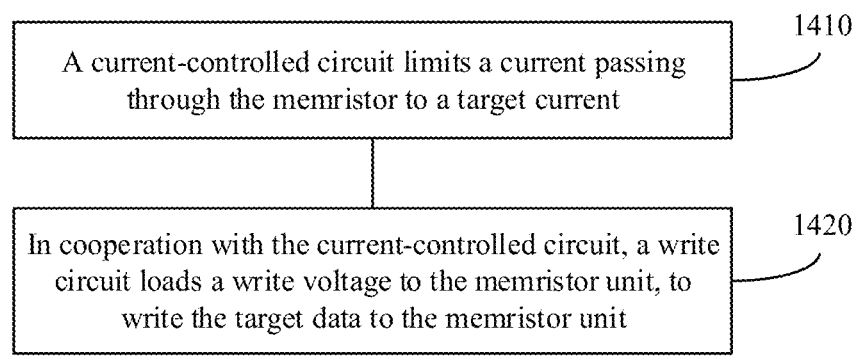
FIG. 14 is a schematic flowchart of a programming method for a storage device according to an embodiment of this application.

The foregoing describes the storage device in the embodiments of this application with reference to FIG. 1 to FIG. 13, and the following describes a method in the embodiments of this application with reference to FIG. 14. It should be noted that the method shown in FIG. 14 may be performed by the storage device described above. An execution process is according to a principle described above, and parameter selection is described above in detail. For brevity, details are not described below.

FIG. 14 is a schematic flowchart of a programming method for a storage device according to an embodiment of this application. The method shown in FIG. 14 may be executed by a device having a control function, for example, may be the programming controller circuit 910 in FIG. 9. The method shown in FIG. 14 includes step 1410 to step 1420.

1410: A current-controlled circuit limits a current passing through the memristor to a target current, where the target current is determined based on target conductance of the memristor and a gate voltage of the transistor, and the target conductance is used to indicate target data to be written into the memristor.

1420: In cooperation with the current-controlled circuit, a write circuit loads a write voltage to the memristor, to write the target data to the memristor.

Optionally, in an embodiment, the target current I, the write voltage $V_b$, the target conductance G, and a drain voltage $V_d$ of the transistor satisfy a formula $$G = \frac{I}{V_b - V_d}.$$

Optionally, in an embodiment, the current-controlled circuit includes a current mirror, the current mirror includes a first branch and a second branch that are connected in parallel, the second branch is connected to the memristor unit, a current passing through the first branch is the target current, and the current mirror is configured to replicate the target current from the first branch to the second branch, to limit a largest current flowing through the memristor unit to the target current.

Optionally, in an embodiment, the current-controlled circuit provides a plurality of currents for the memristor unit, different currents in the plurality of currents correspond to different conductance of the memristor unit, and the plurality of currents include the target current.

Optionally, in an embodiment, a conductance value of first conductance $G_{max}$ in the plurality of pieces of conductance is the largest, the write voltage is less than a preset first write voltage threshold $V_{b\ max}$, the first write voltage threshold $V_{b\ max}$ satisfies a formula and $I_{max}$ represents a current for modulating the conductance of the $$G_{max} = \frac{I_{max}}{V_{bmax} - V_d},$$

memristor unit to the first conductance $G_{max}$.

Optionally, in an embodiment, a conductance value of second conductance $G'_{max}$ in the plurality of pieces of conductance that are of the memristor unit and that correspond to the plurality of currents is the largest, a second write voltage threshold $V'_{b\ max}$ satisfies a formula $$G'_{max} = \frac{I'_{max}}{V'_{bmax} - V'_{max}}, I'_{max}$$

represents a current for modulating conductance of the memristor unit to the second conductance $G'_{max}$, and if the second write voltage threshold is less than an estimated switching voltage of the resistive random access memory, the write voltage is the estimated switching voltage, and the estimated switching voltage is higher than a real switching voltage of the memristor unit.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on a particular application and a design constraint of the technical solutions. A person skilled in the art may use different methods to implement the described functions for each particular application, but it should not be considered that the implementation goes beyond the scope of this application.

It may be clearly understood by a person skilled in the art that for the purpose of convenient and brief description, for a detailed working process of the described system, apparatus, and unit, refer to a corresponding process in the foregoing method embodiments.

In the several embodiments provided in this application, it should be understood that the disclosed system, apparatus, and method may be implemented in other manners. For example, the described apparatus embodiment is merely an example. For example, division into units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, and may be located in one position, or may be distributed on a plurality of network units. Some or all of the units may be selected based on an actual requirement to achieve objectives of solutions of the embodiments.

In addition, function units in the embodiments of this application may be integrated into one processing unit, or each of the units may exist alone physically, or two or more units are integrated into one unit.

When the functions are implemented in a form of a software function unit and sold or used as an independent product, the functions may be stored in a computer-readable storage medium. Based on such an understanding, the technical solutions of this application essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of this application. The foregoing storage medium includes any medium that can store program code, such as a USB flash drive, a removable hard disk, a read-only memory (ROM), a random access memory (RAM), a magnetic disk, or an optical disc.

The foregoing descriptions are merely exemplary specific implementations of this application, but are not intended to limit the protection scope of this application. Any variation or replacement readily figured out by a person skilled in the art within the technical scope disclosed in this application may fall within the protection scope of this application.

What is claimed is:

1. A data writing method for writing data to a memristor unit having a one-transistor and one-resistive random access memory (1T1R) structure, the method comprising:
   limiting, by a current-controlled circuit, a current passing through the memristor unit to a target current, wherein the target current is determined based on a target conductance of the memristor unit and a gate voltage of a transistor in the memristor unit, and the target conductance indicates target data to be written into the memristor unit; and
   in cooperation with the current-controlled circuit, loading, by a write circuit, a write voltage to the memristor unit, to write the target data to the memristor unit;
   wherein loading the write voltage to the memristor unit comprises loading a plurality of set pulses to the memristor unit, wherein first respective set pulses of the plurality of set pulses loaded to the memristor unit each decrease resistance of the memristor unit and increase the current passing through the memristor unit until the current passing through the memristor unit reaches the target current; and
   wherein one or more second respective set pulses of the plurality of set pulses loaded to the memristor unit after the current passing through the memristor unit has reached the target current do not change conductance of the memristor unit.

2. The method according to claim 1, wherein the target current I, the write voltage $V_b$, the target conductance G, and a drain voltage $V_d$ of the transistor satisfy a formula $$G = \frac{I}{V_b - V_d}.$$

3. The data writing method according to claim 1, wherein a quantity of set pulses and pulse widths for the plurality of set pulses is preconfigured based on a model of the memristor unit such that, after the memristor unit is loaded with the preconfigured quantity of set pulses, an initial conductance of the memristor unit is adjusted to the target conductance.

4. The data writing method according to claim 1, further comprising:
   in cooperation with the current-controlled circuit, loading, by the write circuit, a second write voltage to the memristor unit, to write second target data to the memristor unit;
   wherein loading the second write voltage to the memristor unit comprises loading a plurality of reset pulses to the memristor unit, wherein first respective reset pulses of the plurality of reset pulses loaded to the memristor unit each increase resistance of the memristor unit and decrease the current passing through the memristor unit until the current passing through the memristor unit reaches a minimum target current; and
   wherein one or more second respective reset pulses of the plurality of reset pulses loaded to the memristor unit after the current passing through the memristor unit has reached the minimum target current do not change conductance of the memristor unit.

5. The data writing method according to claim 4, wherein a quantity of reset pulses and pulse widths for the plurality of reset pulses is preconfigured based on a model of the memristor unit such that, after the memristor unit is loaded with the preconfigured quantity of reset pulses, an initial conductance of the memristor unit is adjusted to the target conductance.

* * * * *